United States Patent [19]
Jungroth et al.

[11] Patent Number: 5,621,690
[45] Date of Patent: Apr. 15, 1997

[54] NONVOLATILE MEMORY BLOCKING ARCHITECTURE AND REDUNDANCY

[75] Inventors: Owen W. Jungroth, Sonora; Mark D. Winston, El Dorado Hills, both of Calif.

[73] Assignee: Intel Corporation, Santa Clara, Calif.

[21] Appl. No.: 430,344

[22] Filed: Apr. 28, 1995

[51] Int. Cl.$^6$ .............................. G11C 7/00; G11C 29/00
[52] U.S. Cl. ............... 365/200; 365/185.09; 365/185.11; 365/185.13; 365/230.03; 365/230.06
[58] Field of Search .............................. 365/200, 230.03, 365/230.06, 185.09, 185.11, 185.13

[56] References Cited

U.S. PATENT DOCUMENTS

| | | | |
|---|---|---|---|
| 4,281,398 | 7/1981 | McKenny et al. | 365/200 |
| 4,849,943 | 7/1989 | Pfennings | 365/230.03 |
| 4,939,696 | 7/1990 | Katsuo et al. | 365/230.03 |
| 4,958,326 | 9/1990 | Sakurai | 365/218 |
| 4,961,164 | 10/1990 | Miyaoka et al. | 365/177 |
| 4,967,399 | 10/1990 | Kuwabara et al. | 365/230.06 |
| 4,977,538 | 12/1990 | Anami et al. | 365/230.03 |
| 5,065,364 | 11/1991 | Atwood et al. | 365/185 |
| 5,220,528 | 6/1993 | Mielke | 365/185 |
| 5,239,505 | 8/1993 | Fazio et al. | 365/185 |
| 5,245,570 | 9/1993 | Fazio et al. | 365/185 |
| 5,249,158 | 9/1993 | Kynett et al. | 365/230.03 |
| 5,255,217 | 10/1993 | Tan | 365/96 |
| 5,295,101 | 3/1994 | Stephens, Jr. et al. | 365/200 |
| 5,307,316 | 4/1994 | Takemae | 365/200 |
| 5,347,484 | 9/1994 | Kwong et al. | 365/49 |

OTHER PUBLICATIONS

"Progress in WSI SRAM Development ", Ron Bourassa, Tim Coffman, Joe E. Brewer, 1990 Proceedings, International Conference on Wafer Integration, pp. 13–19.

*Primary Examiner*—Do Hyun Yoo
*Attorney, Agent, or Firm*—Blakely, Sokoloff, Taylor & Zafman

[57] ABSTRACT

A nonvolatile memory includes a global line. A plurality of memory blocks and a redundant block are also included in the memory, each block having a plurality of local lines and a decoder for selectively connecting the global line to one of the local lines when the decoder is enabled and for isolating the local lines from the global line when the decoder is disabled. When one of the plurality of blocks is found to be a defective block, the defective block is replaced by the redundant block. Circuitry is provided for disabling the decoder of the defective block and enabling the decoder of the redundant block whenever the defective block is addressed.

17 Claims, 5 Drawing Sheets

NONVOLATILE MEMORY BLOCKING ARCHITECTURE AND REDUNDANCY

FIELD OF THE INVENTION

The present invention pertains to the field of computer memories. More particularly, this invention relates to a blocked electrically erasable and programmable nonvolatile memory incorporating local decoders for blocks and redundant blocks such that when one block is found defective, the defective block does not affect other blocks and can be replaced with a redundant block.

BACKGROUND OF THE INVENTION

One type of prior art flash Erasable and electrically Programmable Read-Only Memory ("flash EPROM")is organized into rows and columns. Memory cells are placed at intersections of word lines and bit lines. The flash EPROM can have a blocked architecture by grouping a number of columns into one block. The flash EPROM can be programmed by a user. Once programmed, the flash EPROM retains its data until erased by electrical erasure. A high erasing voltage is made available to the sources of all the cells in a memory block simultaneously. This results in a block erasure. The flash EPROM can also have a full array erasure by applying the erasing voltage to the sources of all memory cells of the flash EPROM simultaneously. The erased block or array of the flash EPROM can then be reprogrammed with new data.

One type of prior art flash EPROM typically includes redundant memory cells. The redundant memory cells are used to replace defective cells of the main memory array. FIG. 1 shows one prior art redundancy scheme for a flash EPROM.

As can be seen from FIG. 1, flash EPROM 10 includes a main memory 11 that is organized into a number of memory blocks BLOCK0 through BLOCKn. Each block includes word lines and bit lines. The bit lines of a block extend only within the block while the word lines are shared by all the blocks. The array configuration of each block of memory array 11 is shown in FIG. 2.

As shown in FIG. 2, a block 25 of memory array 11 includes bit lines 21a and 21b and word lines 22a and 22b. Block 25 represents the array configuration of each of blocks BLOCK0 through BLOCKn. Word lines 22a and 22b extend beyond block 25 and bit lines 21a and 21b only extend within block 25. Memory cells 25a and 25c have their control gates connected to word line 22a and memory cells 25b and 25d have their control gates connected to word line 22b. The drains of cells 25a and 25b are connected to bit line 21a and the drains of cells 25c and 25d are connected to bit line 21b. The sources of cells 25a–25d are all connected to a source line 23.

Referring back to FIG. 1, each block of memory array 11 also includes a number of redundant columns. For example, BLOCK0 has redundant columns 12 and BLOCKn has redundant columns 12n. Each of the redundant columns within a block can replace one defective column within that block.

Because the word lines of memory array 11 extend to all the blocks of array 11, a redundant row that extends to all the blocks of array 11 is needed to replace a defective row of memory array 11. As can be seen from FIG. 1, memory array 11 includes redundant rows 13A. When rows of memory array 11 are found defective, redundant rows 13A are used to replace the defective row.

Disadvantages are, however, associated with this prior art redundancy scheme. One disadvantage associated is that such redundant arrangement sometimes may not be able to replace a defect in the main memory array. For example, as can be seen from FIG. 2, when word line 22a is shorted to bit line 21b through a defect connection 27, the redundancy scheme as shown in FIG. 1 cannot replace the defective row. This is due to the fact that the redundant rows can only replace the defective rows in the main array when the defective rows are shorted together. If only one row of the main memory array is found defective, the defective row will affect the memory operations of the adjacent rows of the defective row.

Moreover, another disadvantage of the prior art redundancy scheme is that when a block has more defective columns than the number of redundant columns provided, that block simply cannot be repaired by the prior art redundancy scheme even though other blocks may have unused redundant columns. Typically in a flash EPROM, a block has a limited number of redundant columns. This is due to the fact that the more redundant rows and columns within a given flash EPROM, the larger that flash EPROM becomes.

When the defect or defects in the main memory array cannot be fixed by the prior art redundancy scheme, the flash EPROM has to be discarded. The number of the discarded flash EPROM chips typically affects the overall cost of fabricating the flash EPROM. When the number of the discarded flash EPROM chips per silicon wafer increases, the overall fabrication cost of the flash EPROM increases accordingly.

SUMMARY OF THE INVENTION

One of the features of the present invention allows (1) a redundant block of a nonvolatile memory to replace a defective block of the memory and (2) the defective block not to affect other blocks of the memory.

A nonvolatile memory includes a global line. A plurality of blocks and a redundant block are also included in the memory, each block having a plurality of local lines coupled to a plurality of memory cells and a decoder coupled to the global line and the local lines for selecting one of the local lines to be coupled to the global line when enabled and for isolating the local lines from the global line when disabled such that when one of the blocks is found to be a defective block, the defective block does not affect the global line and can be replaced by the redundant block.

A nonvolatile memory includes a global line. A plurality of blocks and a redundant block are provided, each having (1) a local decoder coupled to the global line and (2) a plurality of local lines coupled to a plurality of memory cells and the local decoder. The local decoder of a selected block decodes an address to connect the global line to a selected local line of the local lines while the local decoder of each of the unselected blocks does not connect the global line to any local line within each of the unselected blocks such that when one of the blocks is found defective, the defective block can be replaced by the redundant block without affecting other blocks.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
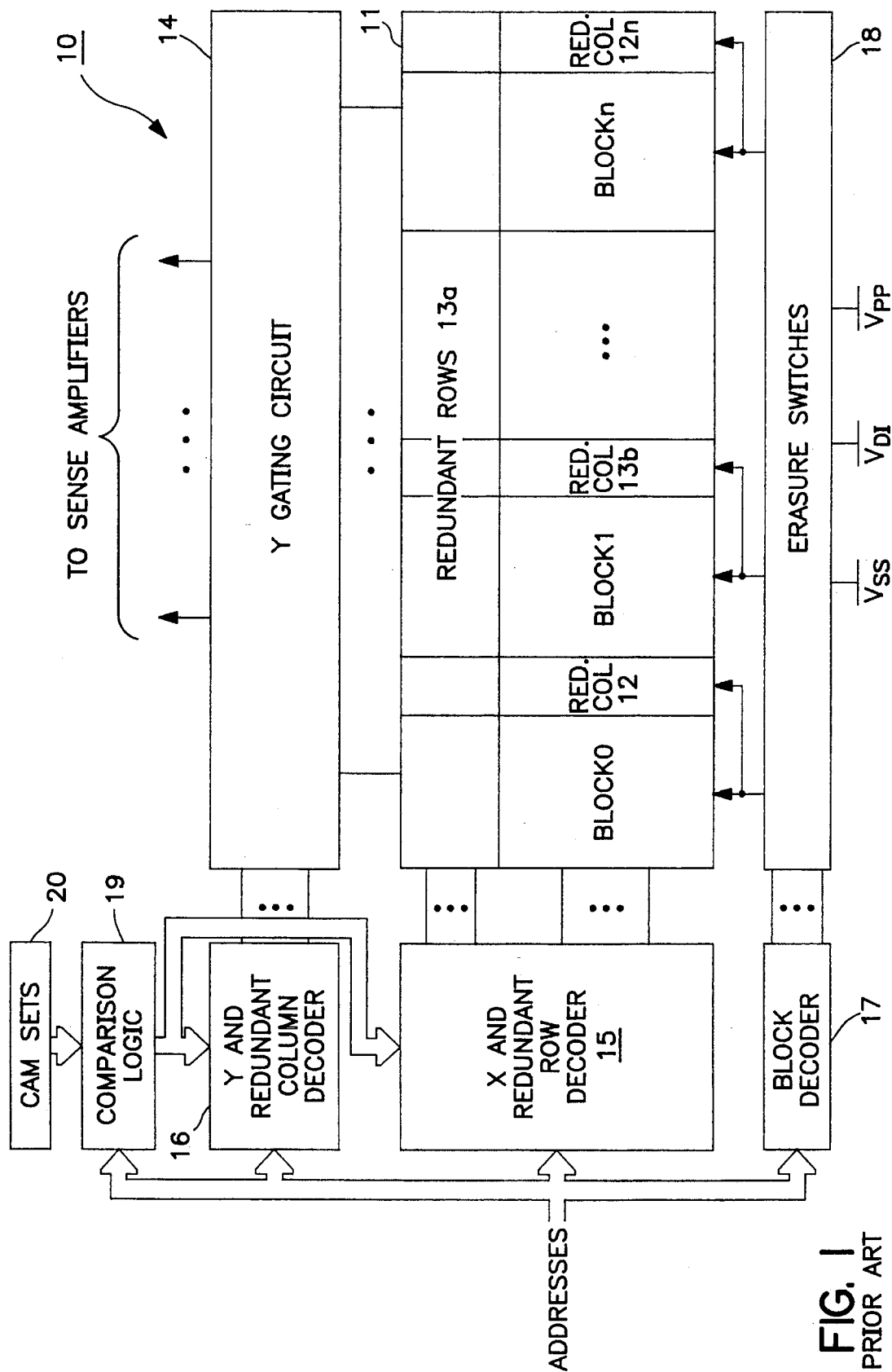
FIG. 1 shows a prior art redundancy arrangement of a flash EPROM having a number of memory blocks.
Figure 2:
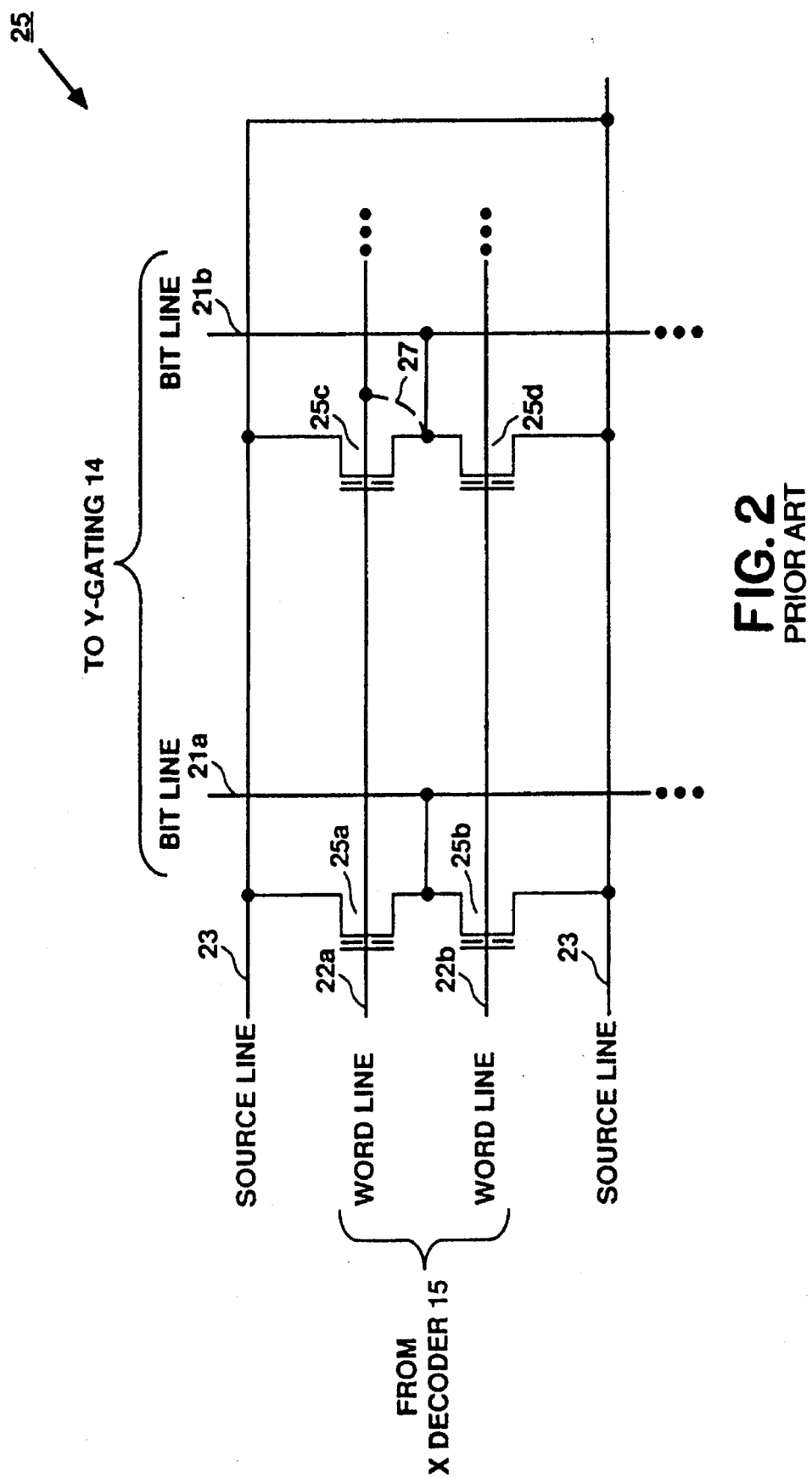
FIG. 2 shows a defect within one of the blocks of the flash EPROM of FIG. 1.
Figure 3:
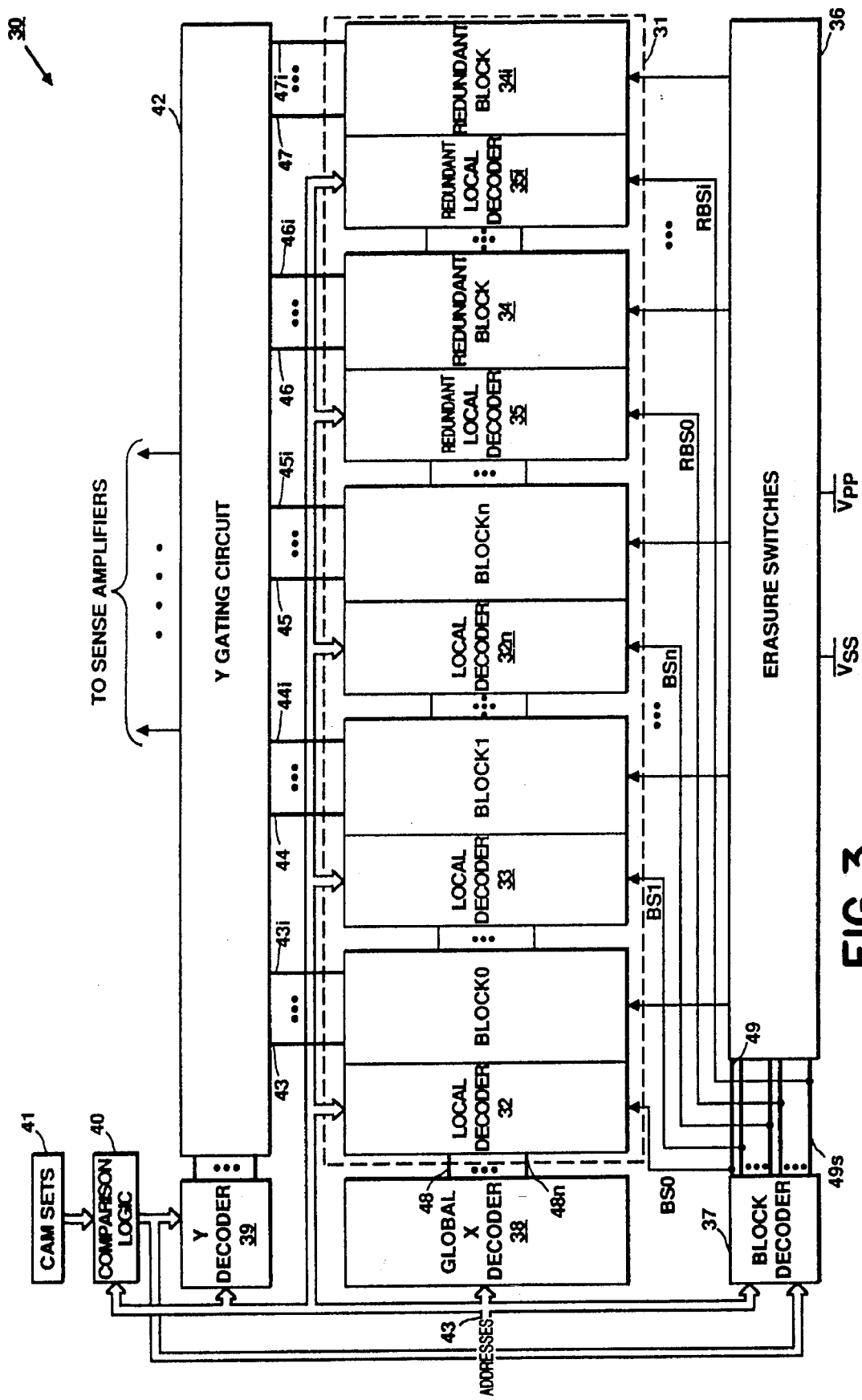
FIG. 3 is a block diagram of a flash EPROM that employs one embodiment of the present invention.

FIG. 3 is a block diagram of the circuitry of flash EPROM 30, which implements an embodiment of the present invention. Flash EPROM 30 includes a memory array 31, which is made up of floating gate flash EPROM cells that store data at addresses. For one embodiment, memory array 31 stores 8 Mbits ("Megabits") of data. For alternative embodiments, memory array 31 can be smaller than or larger than 8 Mbits.

Alternatively, flash EPROM 30 can be other types of nonvolatile memories. For example, flash EPROM 30 can simply be an EPROM ("Electrically Programmable Read-Only Memory").

Flash EPROM 30 can be used in any kind of computer system or data processing system. The computer system within which flash EPROM 30 is used can be a personal computer, a notebook, a laptop, a personal assistant/communicator, a minicomputer, a workstation, a mainframe, a multiprocessor computer, or any other type of computer system. In addition, the system in which flash EPROM 30 is used can be a printer system, a cellular phone system, a digital answering system, or any other data storage system.

For one embodiment, flash EPROM 30 employs MOS circuitry and all the circuitry of flash EPROM 30 resides on a single semiconductor substrate.

For one embodiment, each memory cell of memory array 31 can store one bit of data at one time. For another embodiment, each memory cell of memory array 31 can store multiple bits of data at one time.

Memory array 31 is divided into a number of blocks BLOCK0 through BLOCKn and a number of redundant blocks 34 through 34i. Each of blocks BLOCK0 through BLOCKn includes a local decoder. For example, block BLOCK0 includes a local decoder 32 and block BLOCK1 includes a local decoder 33. In addition, each of redundant blocks 34 through 34i includes a redundant local decoder. For example, redundant block 34 includes a redundant local decoder 35 and redundant block 34i includes a redundant local decoder 35i. Each block of blocks BLOCK0 through BLOCKn and redundant blocks 34 through 34i includes a number of bit lines and local word lines (not shown in FIG. 3). The bit lines of a block only extend within that particular block and the local word lines of a block only extend within the block. For example, bit lines 43 through 43i extend only within BLOCK0 and bit lines 45 through 45i extend only within block BLOCKn. Memory cells are placed at intersections of the local word lines and bit lines. All the bit lines of memory array 31 are connected to a Y gating circuit 42.

The local word lines within each of blocks BLOCK0–BLOCKn and redundant blocks 34–34i are connected to the local decoder of the respective block. In addition, memory array 31 also includes a number of global word lines 48 through 48n. Global word lines 48–48n are connected to each of local decoders 32 through 32n and redundant local decoders 35 through 35i. Global word lines 48–48n extend through all of blocks BLOCK0–BLOCKn and redundant blocks 34–34i. Global word lines 48–48n are, however, not physically connected to the local word lines of each block of memory array 31 but can be electrically connected to the local word lines of each block via the respective local decoder of that block. For example, local decoder 32 allows global word lines 48–48n to be connected to the local word lines of block BLOCK0 and redundant local decoder 35 can cause global word lines 48–48n to be connected to the local word lines of redundant block 34.

Alternatively, memory array 31 can be constructed such that each of blocks BLOCK0 through BLOCKn and redundant blocks 34–34i has a number of word lines and local bit lines. The word lines only extend within the block and the local bit lines only extend within the block. The local bit lines of a block are connected to a local decoder of that block. In addition, memory array 31 includes a number of global bit lines that extend through all the blocks of memory array 31. The global bit lines are connected to the local decoder of each of the blocks. The global bit lines are then connected to Y decoder 39 via Y gating circuit 42.

Figure 4:
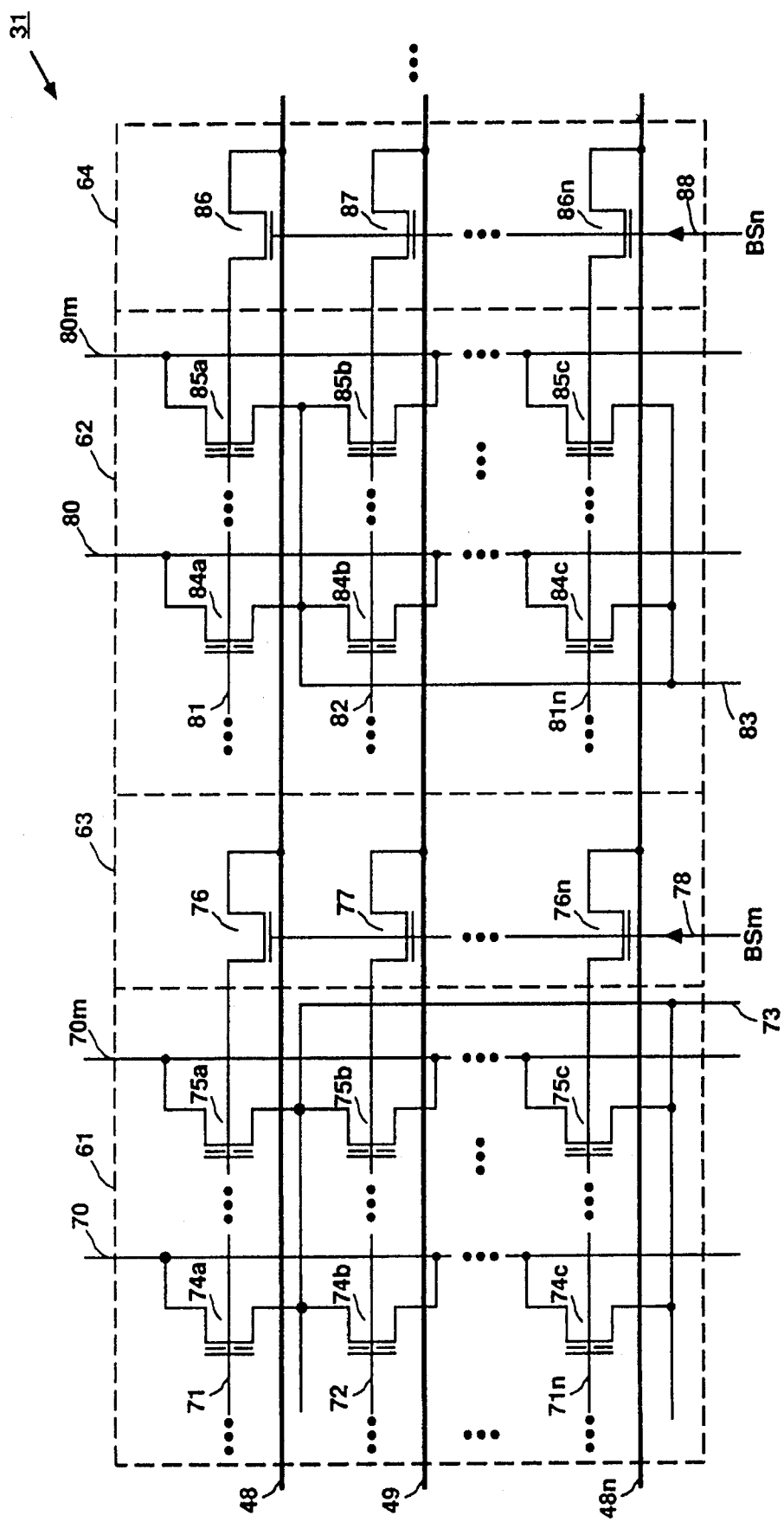
FIG. 4 illustrates one array configuration of the flash EPROM of FIG. 3 with the local decoders.
Figure 5:
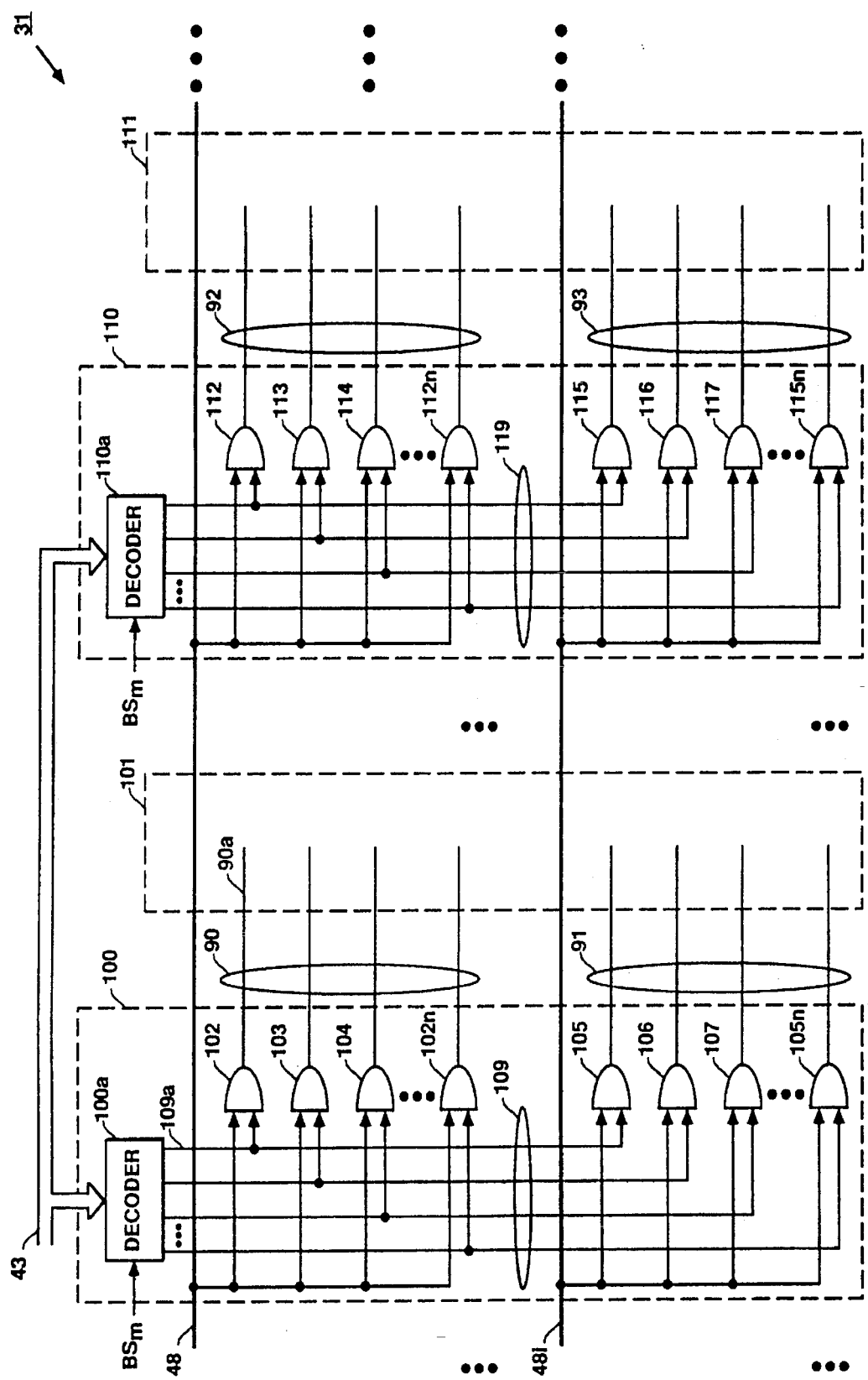
FIG. 5 illustrates another array configuration of the flash EPROM of FIG. 3 with the local decoders.

FIG. 3 does not show the local word lines within each of the blocks of memory array 31. FIG. 4 shows one array configuration of each block of memory array 31, including local decoder and local word lines, which will be described in more detail below. FIG. 5 shows another array configuration of each block of memory array 31, including local decoder and local word lines, which will also be described in more detail below.

Referring to FIG. 4, blocks 61 and 62 can be any two adjacent blocks BLOCK0–BLOCKn and redundant blocks 34–34i of memory array 31 of FIG. 3. As can be seen from FIG. 4, each of blocks 61 and 62 includes one of local decoders 63 and 64. Global word lines 48 through 48n are connected to each of local decoders 63 and 64.

Block 61 includes bit lines 70 through 70m and local word lines 71 through 71n. Block 62 includes bit lines 80 through 80m and local word lines 81 through 81n. Block 61 includes a common source line 73 and block 62 includes a common source line 83. Each of common source lines 73 and 83 is connected to an erasure switch of erasure switches 36 (FIG. 3). In addition, each of blocks 61–62 includes a number of flash EPROM cells arranged at the intersections of the bit lines and local word lines of that block. FIG. 4 shows cells 74a through 75c for block 61 and cells 84a through 85c for block 62. Each cell in one block has its drain connected to one bit line, it control gate connected to one local word line and its source connected to the common source line of that block. For example, cell 74a has its drain connected to bit line 70, its control gate connected to local word line 71, and its source connected to source line 73. It shall be noted that none of the cells within each of blocks 61 and 62 is physically connected to global word lines 48–48n. Bit lines 70–70m and 80–80m are then connected to Y gating circuit 42 (FIG. 3). Each of the local word lines within one block are connected to the local decoder of that block. For example, local word lines 71–71n are connected to local decoder 63 of block 61 and local word lines 81–81n are connected to local decoder 64 of block 62.

As can be seen in FIG. 4 and in accordance with one embodiment of the present invention, each of decoders 63–64 includes a number of one-to-one decoders, each being formed by a select transistor. For example, local decoder 63 includes a number of select transistors 76 through 76n, each being connected between one of global word lines 48–48n and one of local word lines 71–71n. Likewise, local decoder 64 includes a number of select transistors 86 through 86n, each being connected between one of global word lines 48–48n and one of local word lines 81–81n. This indicates that each of decoders 63–64 can selectively connect global word lines 48–48n to the respective local word lines within the respective block. For example, when transistors 76–76n are turned on, global word lines 48–48n are connected to local word lines 71–71n of block 61. Similarly, when transistors 86–86n of local decoder 64 are turned on, each of global word lines 48–48n is connected to its respective one of local word lines 81–81n. In this case, when one of global word lines 48–48n is the selected word line, the select transistor of local decoder 64 also causes the corresponding local word line to be the selected word line.

Because FIG. 4 shows that each of local decoders 63 and 64 only includes one-to-one decoders, each of local decoders 63 and 64 does not receive any additional address bits from bus 43. In this case, bus 43 is not connected to local decoders 63–64.

As can be seen from FIG. 4, each of select transistors 76–76n of local decoder 63 is controlled to be on and off by a block select signal BSm applied on line 78. In addition, each of select transistors 86–86n of local decoder 64 is controlled to be on and off by a block select signal BSn applied on line 88. Lines 78 and 88 are connected to block decoder 37 (FIG. 3) to receive the respective block select signals BSm and BSn.

It shall be noted that FIG. 4 only shows one embodiment of the present invention for local decoders 63 and 64. Alternatively, local decoders 63 and 64 can be implemented by other types of decoders. For example, each of local decoders 63–64 can include a number of two-to-four decoders, each being connected to two of global word lines 48–48n and four of the local word lines for decoding a select data received from the two global word lines to select one of the four local word lines. When this occurs, the block select signal for that local decoder is connected to each of the two-to-four decoders of the local decoder for enabling each of the two-to-four decoders. Further, the local decoder of a block may be implemented by a number of three-to-eight decoders, each being connected to three of global word lines 48–48n and eight of the local word lines within that block. Moreover, FIG. 5 illustrates another embodiment of local decoders 32–32n and 35–35n of FIG. 3. Alternatively, other types of decoding schemes may be used.

As can be seen from FIG. 4, global word lines 48–48n are isolated from local word lines 71–71n by local decoder 63 and from local word lines 81–81n by local decoder 64. When local decoder 63 is enabled by the block select signal BSm, global word lines 48–48n are electrically connected to local word lines 71–71n. Similarly, when local decoder 64 is enabled by the block select signal BSn, global word lines 48–48n are electrically connected to local word lines 81–81n.

In accordance with one embodiment of the present invention, each of the local word lines of a block of memory array 31 is formed by a continuous polysilicon strip that also forms the control gates of the flash EPROM cells along one row within that block. For example, local word line 71 is formed by a polysilicon strip that also forms the control gate of each of flash EPROM cells 74a through 75a. In addition, local word line 81n of block 62 is formed by a polysilicon strip that also forms the control gate of each of flash EPROM cells 84c through 85c. Each of global word lines 48–48n is formed by a second metal layer that is above a first metal layer that forms each of the bit lines of memory array 31. The first metal layers in a block are above the polysilicon strips that form the local word lines within that block.

By isolating global word lines 48–48n from local word lines 71–71n of block 61 and from local word lines 81–81n of block 62, global word lines 48–48n are separated from each of the blocks of memory array 31 and do not disturb other blocks of memory array 31 when one block of memory array 31 is selected to be connected to global word lines 48–48n for a memory operation. For example, when select transistor 76 connects global word line 48 to local word line 71 of block 61 for a programming operation, the high programming voltage $V_{PP}$ applied on global word line 48 does not disturb memory cells 84a–85a of unselected block 62. In other words, the memory cells of the unselected blocks of memory array 31 do not experience any gate disturbance when a selected block undergoes the programming operation. In addition, because global word lines 48–48n are not physically connected to the memory cells within each block of memory array 31 and are a number of layers above the local word lines of each block, each of global word lines 48–48n is not affected when its corresponding local word in one block is found defective. For example, if local word lines 71 of block 61 is found defective, none of global word lines 48–48n is affected. This is due to the fact that local decoder 63 separates local word lines 71–71n from global word lines 48–48n. This in turn causes each of local word lines 81–81n of block 62 not to be affected at all by the defect along local word line 71. As described above, the defect along local word line 71 can be a short to one of bit lines 70–70m, or a short to local word line 49. As is known, a defective word line typically affects the memory operations of its adjacent rows of memory cells. When this happens, local word line 71 is regarded as a defective word line. By isolating the local word lines of a block from the global word lines, a defect in a block of memory array 31 is essentially isolated from other blocks. This therefore allows a defective block to be replaced by a redundant block without affecting the memory operations of other blocks. In addition, this allows a defective block to be replaced by a redundant block which would otherwise not be repaired by the prior art redundancy scheme.

When block 61 is one of blocks BLOCK0–BLOCKn and block 62 is one of redundant blocks 34–34i, block 62 can be used to replace block 61 by asserting the BSn block select signal whenever the BSm block select signal for block 61 should be asserted.

Referring to FIG. 5, array 31 is shown with another configuration for the local decoders. As can be seen from FIG. 5, blocks 101 and 111 can be any two adjacent blocks of blocks BLOCK0–BLOCKn and redundant blocks 34–34i of FIG. 3 and local decoders 100 and 110 can be any two local decoders 32–32i and 35–35i. Block 101 is connected to local decoder 100 and block 111 is connected to local decoder 110. FIG. 5 only shows two global word lines 48 and 48i for illustration. As can be seen from FIG. 5, each global word line is connected to a number of local word lines within a block via the local decoder. For example, global word line 48 is connected to a number of local word lines 90 of block 1 01 via local decoder 100 and to a number of local word lines 92 of block 111 via local decoder 110. Similarly, global word lines 48i is connected to a number of local word lines 91 of block 101 via local decoder 100 and to a number of local word lines 93 of block 111 via local decoder 110. Each local word line is connected to the control gates of a row of memory cells within one block. Although FIG. 5 does not show the memory cells within each block, it is, however, evident that the array configuration of each of blocks 101 and 111 can be easily obtained in light of FIG. 4.

As can be seen from FIG. 5, each of local decoders 100 and 110 includes an address decoder and a number of AND gates. Each AND gate is connected to a global word line and a select line of the address decoder. For example, address decoder 100a includes a number of select lines 109, each being connected to one of AND gates 102 through 102n and one of AND gates 105 through 105n. Similarly, address decoder 110a includes a number of select lines 119, each being connected to one of AND gates 112 through 112n and one of AND gates 115 through 115n. Decoders 100a and 110a both receive a portion of an X address. Decoder 100a is enabled by a block select signal BSm and decoder 110a is enabled by a block select signal BSn. In this embodiment, each of decoders 100a and 110a is also connected to bus 43 of FIG. 3 to receive a portion of an X address and global X decoder 38 receives the remaining portion of the X address. For one embodiment, decoders 100a and 110a receive a number of the least significant bits of an X address and global X decoder 38 receives the remaining bits of the address.

In alternative embodiments, AND gates 102–102n, 105–105n, 112–112n, and 115–115ncan be replaced with other types of logic circuits.

When, for example, global word line 48 is the selected global word line and block 101 is the selected block for memory operations, the BSm signal enables decoder 100a while the BSn signal disables decoder 110a. Decoder 100a then decodes the address bits received via bus 43 and selects one of select lines 109. For example, when decoder 100a selects select line 109a, AND gate 102 is therefore enabled to connect selected global word line 48 to local word line 90a. Although AND gate 105 is also enabled, AND gate 105 does not select the corresponding local word line because global word line 48i is not selected. Meanwhile, decoder 110a is disabled and does not select any of select lines 119 such that all of AND gates 112–112n are blocked and none of local word lines 92 is connected to selected global word line 48.

Referring back to FIG. 3, global word lines 48–48n are also connected to X decoder 38 of flash EPROM 30. X decoder 38 is the row decoder of memory array 31. X decoder 38 receives a row address from bus 43 to select one of global word lines 48–48n, or to generate a select data onto at least one of global word lines 48–48n. X decoder 38, however, does not select any local word line within each block of memory array 31.

For one embodiment, X decoder 38 selects a selected one of global word lines 48–48n for every address applied. For another embodiment, X decoder 38 generates a select data onto two or more of global word lines 48–48n for every address applied.

In addition, flash EPROM 30 includes a Y decoder 39 and a block decoder 37. Y decoder 39 is connected to Y gating circuit 42. Y decoder 39 receives a column address from bus 43 to select one byte of (i.e., eight) bit lines or one word of (i.e., sixteen) bit lines from a selected block of memory array 31 via Y gating circuit 42.

Block decoder 37 selects a selected block for every block address applied. Block decoder 37 selects the selected block by enabling the local decoder of the selected block. Block decoder 37 does this by generating the appropriate one of the block select signals BS0–BSn. In addition, block decoder 37 can also enable one of redundant blocks 34–34i by enabling the respective redundant local decoder of that block with one of the block select signals RBS0–RBSi. Block decoder 37 is also connected to bus 43 for receiving the block address. For one embodiment, the block address of flash EPROM 30 is part of the column address received in Y decoder 39. Block decoder 37 outputs the block select signals BS0 through BSn and RBS0 through RBSi via a number of block select lines 49 through 49s. In addition, block select lines 49–49s are also connected to erasure switches 36.

Erasure switches 36 includes a number of switches, each being coupled to the common source line of one block of blocks BLOCK0–BLOCKn and redundant blocks 34–34i. Each of erasure switches 36 selectively connects the $V_{SS}$ (i.e., ground) or $V_{PP}$ (i.e., erasure) voltage to the common source line of its associated block in accordance with the block select signal from one of select lines 49–49s during the memory operations (i.e., read, programming, and erasure operations).

Each of block select signals BS0 through BSn and RBS0 through RBSi is applied to the local decoder of one of blocks BLOCK0–BLOCKn and redundant blocks 34–34i. For example, the block select BS0 signal is applied to local decoder 32 and the block select RBS0 signal is applied to redundant local decoder 35. When the BS0 signal is asserted by block decoder 37, local decoder 32 is enabled to receive the select data from global word lines 48–48n to select one of the local word lines of block BLOCK0. When the RBS0 signal is asserted by block decoder 37, redundant local decoder 35 is enabled to receive the select data from global word lines 48–48n to select one of the local word lines of redundant block 34.

Flash EPROM 30 also includes a comparison logic 40 and CAM ("Content Addressable Memory") sets 41 connected to comparison logic 40. CAM sets 41 include a number of sets of CAM cells, each acting as a storage to store data. For one embodiment, each set of CAM sets 41 is fourteen bits wide and CAM sets 41 include eight CAM sets. Alternatively, the number of CAM sets 41 can be larger or smaller than eight and each CAM set can have more or fewer than fourteen bits.

Each set of CAM sets 41 is used to activate a redundant block for replacing a defective block. When a CAM set of CAM sets 41 is used to activate a redundant block for replacing a defective block of blocks BLOCK0–BLOCKn, that CAM set stores the block address of the defective block and that of the redundant block for replacing the defective block. For example, if block BLOCK1 is found defective and needs to be replaced by redundant block 34i, the block address of block BLOCK1 and that of redundant block 34i are then stored in a CAM set of CAM sets 41. Whenever an address is applied to bus for addressing flash EPROM 30, that address is also applied to comparison logic 40.

During read operation, block decoder 37 asserts all block select BS1–BSn and RBS0–RBSi signals to speed up the read operation. Alternatively, on device power up of flash EPROM 30, comparison logic 40 causes block decoder 37 to disable the block select signal of all the defective blocks of memory array 31. During read operation, when an address is received, comparison logic 40 compares the incoming address with the block addresses of all the defective blocks stored in CAM sets 41. If the incoming address is directed to block BLOCK1 and BLOCK1 is replaced by redundant block 34i (i.e., comparison logic 40 detects a match), comparison logic 40 causes Y decoder 39 to act on the block address of redundant block 34i instead of that of the incoming address.

During programming operation, when an address is applied to bus 43, comparison logic 40 compares the incoming address with the block addresses of all the defective blocks that are stored in CAM sets 41. If the incoming address is directed to block BLOCK1 and block BLOCK1 is replaced by redundant block 30i (i.e., comparison logic 40 detects a match), comparison logic 40 causes block decoder 37 not to act on the incoming address. In addition, comparison logic 40 applies the block address of redundant block 34i to block decoder 37 such that redundant local decoder 35i instead of local decoder 33 is enabled. In addition, comparison logic 40 also causes Y decoder 39 to act on the block address of redundant block 34i instead of that of the incoming address. During erasure operation, because the Y address only contains the block address of a selected block, comparison logic 40 does not cause Y decoder 29 to act.

When block decoder 37 is controlled by comparison logic 40 to access redundant block 34i whenever block BLOCK1 is addressed, block decoder 37 asserts the block select RBSi signal and deasserts the block select BS1 signal. This can be done by any conventional means and circuitry. Comparison logic 40 can be any known comparison logic.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A nonvolatile memory, comprising:
   (A) a global line;
   (B) a plurality of memory blocks and a redundant block, each comprising
      (i) a plurality of local lines;
      (ii) a decoder coupled to the global and local lines for selectively coupling the global line to one of the local lines in accordance with an address information when the decoder is enabled and for isolating the local lines from the global line when the decoder is disabled such that when one of the memory blocks is a defective block, the defective block does not affect the global line and can be replaced by the redundant block;
   (C) circuitry for disabling the decoder of the defective block and enabling the decoder of the redundant block only when the defective block is addressed.

2. The nonvolatile memory of claim 1, wherein each of the memory blocks and the redundant block further comprises memory cells that are electrically erasable and programmable, and each of the memory cells stores a plurality of data bits at one time.

3. The nonvolatile memory of claim 1, wherein the nonvolatile memory is an electrically programmable and erasable memory.

4. The nonvolatile memory of claim 1, wherein the nonvolatile memory is for use in a data processing system.

5. The nonvolatile memory of claim 1, wherein the global line is a global word line and the local lines are local word lines.

6. The nonvolatile memory of claim 1, wherein the global line is a global bit line and the local lines are local bit lines.

7. A nonvolatile memory, comprising:
   (A) a plurality of global lines, each being selected by an address of the nonvolatile memory;
   (B) a plurality of memory blocks and a redundant block, each comprising
      (i) a plurality of local lines;
      (ii) a plurality of select transistors, each for coupling one of the global lines to one of the plurality of local lines in accordance with a block select signal, wherein the redundant block can replace a defective block of the memory blocks;
   (C) circuitry for disabling the select transistors of the defective block and enabling the select transistors of the redundant block only when the defective block is addressed.

8. The nonvolatile memory of claim 7, wherein when the select transistors in one of the plurality of blocks are not switched on by the block select signal of that block, the local lines in that block are isolated from the global lines.

9. The nonvolatile memory of claim 7, wherein the each of the memory blocks and the redundant block further comprises memory cells that are electrically erasable and programmable, and each of the memory cells stores a plurality of data bits at one time.

10. The nonvolatile memory of claim 7, wherein the nonvolatile memory is an electrically programmable and erasable memory.

11. The nonvolatile memory of claim 7, wherein the nonvolatile memory is for use in a data processing system.

12. The nonvolatile memory of claim 7, wherein the global lines are global word lines and the local lines are local word lines.

13. The nonvolatile memory of claim 7, wherein the global lines are global bit lines and the local lines are local bit lines.

14. A nonvolatile memory, comprising:
   (A) a global line;
   (B) a plurality of blocks and a redundant block, each comprising
      (i) a plurality of local lines;
      (ii) a local decoder coupled to the global line and the local lines for decoding an address to connect a selected local line of the local lines to the global line when the local decoder is enabled by a block select signal and for isolating the local lines from the global line when the local decoder is disabled such that when one of the blocks is a defective block, the defective block does not affect the global line and can be replaced by the redundant block;
   (C) circuitry for disabling the local decoder of the defective block and enabling the local decoder of the redundant block only when the defective block is addressed.

15. The nonvolatile memory of claim 14, wherein the local decoder of each of the blocks and the redundant block further comprising
   (i) a decoder coupled to receive the address;
   (ii) a plurality of logic circuits, each being coupled to the global line, one of the local lines, and the decoder.

16. The nonvolatile memory of claim 14, wherein the global line is a global word line and the local lines are local word lines.

17. The nonvolatile memory of claim 14, wherein the global line is a global bit line and the local lines are local bit lines.

* * * * *